United States Patent
Lin et al.

(10) Patent No.: US 9,165,613 B2
(45) Date of Patent: Oct. 20, 2015

(54) SAMPLE-AND-HOLD CURRENT SENSE AMPLIFIER AND RELATED METHOD

(71) Applicant: Taiwan Semiconductor Manufacturing Company, Ltd., Hsin-Chu (TW)

(72) Inventors: Ku-Feng Lin, New Taipei (TW); Hung-Chang Yu, Hsin-Chu (TW); Yue-Der Chih, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 58 days.

(21) Appl. No.: 14/016,917

(22) Filed: Sep. 3, 2013

(65) Prior Publication Data

US 2015/0063048 A1  Mar. 5, 2015

(51) Int. Cl.
*G11C 7/02* (2006.01)
*G11C 7/06* (2006.01)
*G11C 7/08* (2006.01)

(52) U.S. Cl.
CPC ............... *G11C 7/062* (2013.01); *G11C 7/067* (2013.01); *G11C 7/08* (2013.01); *G11C 2207/063* (2013.01)

(58) Field of Classification Search
CPC .......................... H03F 3/005; H03F 2200/267
USPC ........... 365/185.21, 185.22, 189.011, 189.07, 365/210.1
See application file for complete search history.

(56) References Cited

U.S. PATENT DOCUMENTS

| | | | |
|---|---|---|---|
| 8,685,324 B2* | 4/2014 | Fife | 422/68.1 |
| 8,902,641 B2* | 12/2014 | Chih et al. | 365/158 |
| 8,907,703 B1* | 12/2014 | Trampitsch | 327/91 |
| 2014/0204985 A1* | 7/2014 | Cowley et al. | 375/219 |
| 2014/0239161 A1* | 8/2014 | Meynants et al. | 250/214 SW |
| 2014/0269030 A1* | 9/2014 | Chih et al. | 365/158 |

* cited by examiner

*Primary Examiner* — Fernando Hidalgo
(74) *Attorney, Agent, or Firm* — Slater & Matsil, L.L.P.

(57) ABSTRACT

A device includes an amplifier and a first switched current sampler. The first switched current sampler includes a first transistor, a first capacitor, and first, second, and third switches. The first capacitor has a first terminal electrically connected to a gate electrode of the first transistor, and a second terminal electrically connected to a source electrode of the first transistor. The first switch has a first terminal electrically connected to a first current source, and a second terminal electrically connected to the gate electrode of the first transistor. The second switch has a first terminal electrically connected to the first current source, and a second terminal electrically connected to a drain electrode of the first transistor. The third switch has a first terminal electrically connected to the drain electrode of the first transistor, and a second terminal electrically connected to a first input terminal of the amplifier.

20 Claims, 4 Drawing Sheets

SAMPLE-AND-HOLD CURRENT SENSE AMPLIFIER AND RELATED METHOD

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the sub-20 nm node).

Shrinking the semiconductor process node entails reductions in operating voltage and current consumption of electronic circuits developed in the semiconductor process node. For example, operating voltages have dropped from 5V to 3.3V, 2.5V, 1.8V, and even 0.9V. A wave of mobile device popularity has increased pressure in the industry to develop low power circuits that only drain minimal operating current from batteries that power the mobile devices. At the same time, access speed of memory devices is expected to become faster.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely sense amplifier circuits and related methods. Other embodiments may also be applied, however, to other types of sensing circuits.

Throughout the various figures and discussion, like reference numbers refer to like objects or components. Also, although singular components may be depicted throughout some of the figures, this is for simplicity of illustration and ease of discussion. A person having ordinary skill in the art will readily appreciate that such discussion and depiction can be and usually is applicable for many components within a structure.

In the following disclosure, a novel sense amplifier circuit and method are introduced. The sense amplifier circuit uses a sample-and-hold circuit to reduce mismatch of the sense amplifier circuit.

Figure 1:
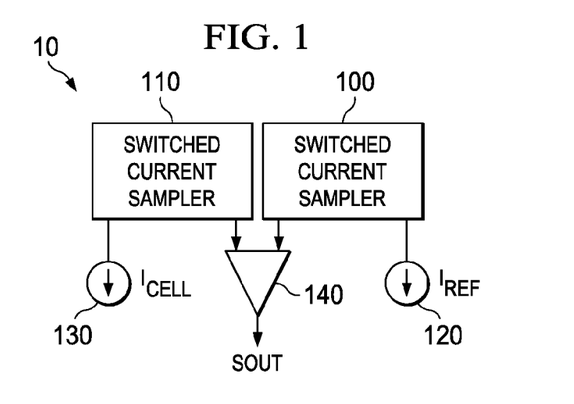
FIG. 1 is a diagram showing a sense amplifier circuit in accordance with various embodiments of the present disclosure.

FIG. 1 is a diagram showing a sense amplifier circuit 10 in accordance with various embodiments of the present disclosure. In some embodiments, the sense amplifier circuit 10 is utilized as part of a readout circuit attached to a memory array. In some embodiments, the memory array includes magnetic random access memory (MRAM) bits, resistive random access memory (RRAM, ReRAM) bits, or the like. A cell current source 130 represents cell current $I_{CELL}$ based on a logical state (e.g., high or low) of a memory bit of the memory array. A reference current source 120 generates a reference current $I_{REF}$ as a point of reference for determining the logical state of the memory bit by the cell current $I_{CELL}$.

A reference-side switched current sampler 100 is electrically connected to the reference current source 120. The reference-side switched current sampler 100 is a sample-and-hold circuit that samples the reference current $I_{REF}$, and outputs a sampled reference current $I_{REFS}$ to an amplifier 140.

A cell-side switched current sampler 110 is electrically connected to the cell current source 130. The cell-side switched current sampler 110 is a sample-and-hold circuit that samples the cell current $I_{CELL}$, and outputs a sampled cell current $I_{CELLS}$ to the amplifier 140. The amplifier 140 outputs an output signal SOUT having a level depending on which of the sampled cell current $I_{CELLS}$ and the sampled reference current $I_{REF}$ is larger.

Figure 2:
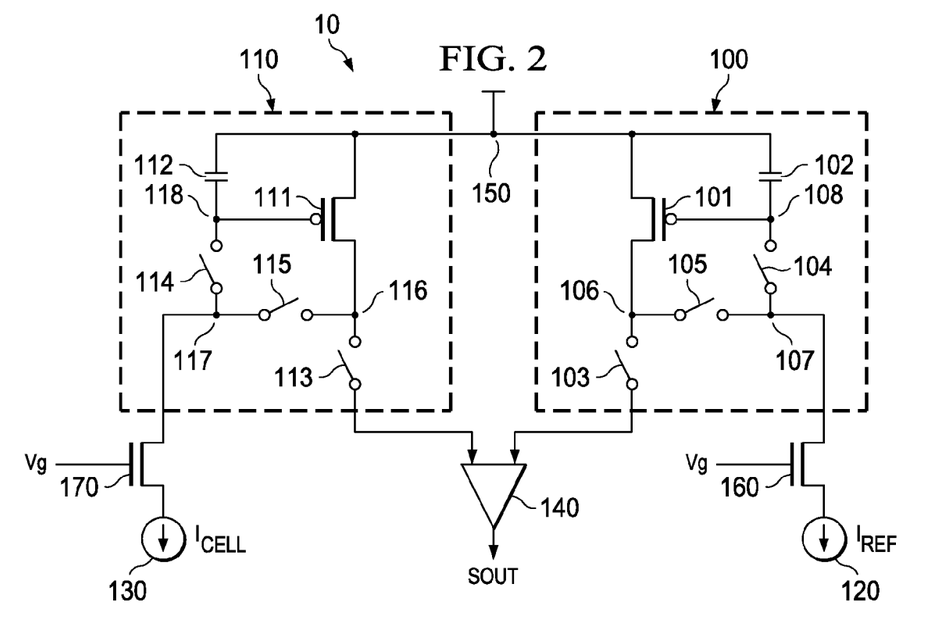
FIG. 2 is a circuit schematic diagram of the sense amplifier circuit in accordance with various embodiments of the present disclosure.

FIG. 2 is a circuit schematic diagram of the sense amplifier circuit 10 in accordance with various embodiments of the present disclosure. A source electrode of a first transistor 101 of the reference-side switched current sampler 100 is electrically connected to a power supply node 150 of the sense amplifier circuit 10. A gate electrode of the first transistor 101 is electrically connected to a node 108. A drain electrode of the first transistor 101 is electrically connected to a node 106. In some embodiments, the first transistor 101 is a P-type metal-oxide-semiconductor (PMOS) transistor.

In some embodiments, a first terminal of a first capacitor 102 is electrically connected to a direct current (DC) bias node, such as the power supply node 150 (the source electrode of the first transistor 101). In some embodiments, the first terminal of the first capacitor 102 is electrically connected to a DC bias node of the sense amplifier circuit 10 other than the power supply node 150 (e.g., a ground node or fixed bias node). A second terminal of the first capacitor 102 is electrically connected to the node 108 (the gate electrode of the first transistor 101).

A first terminal of a first switch 103 is electrically connected to the node 106. A second terminal of the first switch 103 is electrically connected to a first input terminal of the amplifier 140. A first terminal of a second switch 104 is electrically connected to the node 108 (the gate electrode of the first transistor 101). A second terminal of the second switch 104 is electrically connected to a node 107. A first terminal of a third switch 105 is electrically connected to the node 107. A second terminal of the third switch 105 is electrically connected to the node 106 (the drain electrode of the first transistor 101).

A drain electrode of a third transistor 160 is electrically connected to the node 107. A source electrode of the third transistor 160 is electrically connected to the reference current source 120. A gate electrode of the third transistor 160 is biased by a gate voltage Vg. In some embodiments, the gate voltage Vg is substantially ½ of power supply voltage (e.g., VDD) at the node 150.

A source electrode of a second transistor 111 of the cell-side switched current sampler 110 is electrically connected to the power supply node 150. A gate electrode of the second transistor 111 is electrically connected to a node 118. A drain electrode of the second transistor 111 is electrically connected to a node 116. In some embodiments, the second transistor 111 is a PMOS transistor.

A first terminal of a second capacitor 112 is electrically connected to a DC bias node, such as the power supply node 150 (the source electrode of the second transistor 111) or other DC bias node (e.g., a ground node or a fixed bias node). A second terminal of the second capacitor 112 is electrically connected to the node 118 (the gate electrode of the second transistor 111).

A first terminal of a fourth switch 113 is electrically connected to the node 116. A second terminal of the fourth switch 113 is electrically connected to a second input terminal of the amplifier 140. A first terminal of a fifth switch 114 is electrically connected to the node 118 (the gate electrode of the second transistor 111). A second terminal of the fifth switch 114 is electrically connected to a node 117. A first terminal of a sixth switch 115 is electrically connected to the node 117. A second terminal of the sixth switch 115 is electrically connected to the node 116 (the drain electrode of the second transistor 111).

A drain electrode of a fourth transistor 170 is electrically connected to the node 117. A source electrode of the fourth transistor 170 is electrically connected to the cell current source 130. A gate electrode of the fourth transistor 170 is biased by a gate voltage Vg.

Figure 3:
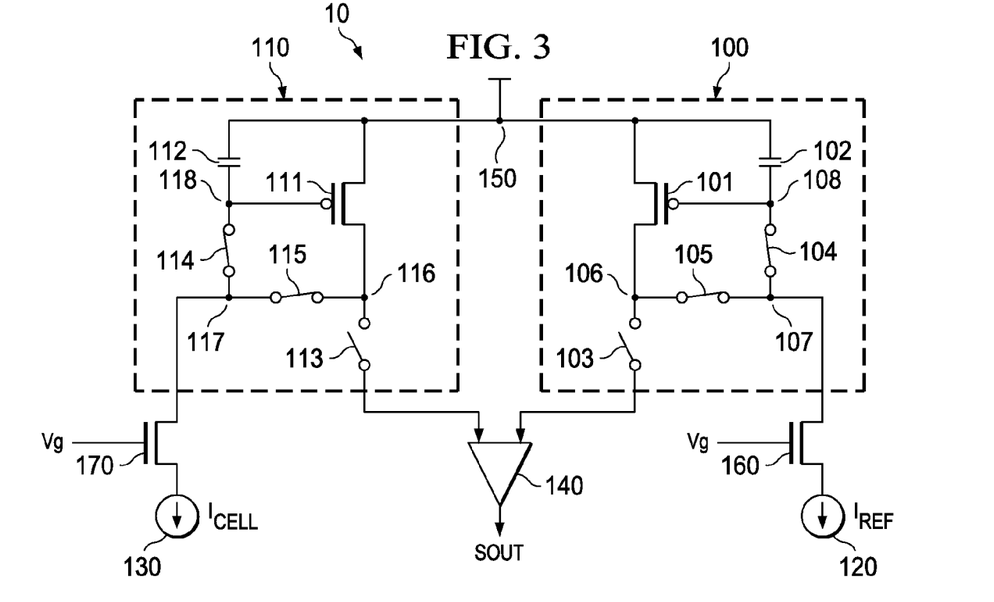
FIG. 3 is a circuit schematic diagram of the sense amplifier circuit in a first phase in accordance with various embodiments of the present disclosure.

FIG. 3 is a circuit schematic diagram of the sense amplifier circuit 10 in a first phase in accordance with various embodiments of the present disclosure. In some embodiments, the first phase is a charge (or "pre-charge") phase. In the first phase, the second, third, fifth and sixth switches 104, 105, 114, 115 are closed (turned on, conduct), and the first and fourth switches 103, 113 are open (turned off, do not conduct). When the sense amplifier circuit 10 is selected, the gate voltage Vg is set to a level sufficient to turn on the third and fourth transistors 160, 170.

In the first phase, the first transistor 101 is diode-connected, and a source-gate voltage $V_{SG1}$ is generated across the source and gate electrodes (node 150 and node 108) of the first transistor 101. The source-gate voltage $V_{SG1}$ is dependent on magnitude of the reference current $I_{REF}$. The reference current $I_{REF}$ flows through the third transistor 160 to pull down voltage at the gate electrode of the first transistor 101. The reference current $I_{REF}$ builds up negative charge at the node 108 to set up a potential difference with the node 150. Higher reference current $I_{REF}$ corresponds to higher source-gate voltage $V_{SG1}$, and lower reference current $I_{REF}$ corresponds to lower source-gate voltage $V_{SG1}$. Information about the reference current $I_{REF}$ (e.g., its magnitude) is stored on the first capacitor 102 in the first phase.

Similarly, in the first phase, the second transistor 111 is diode-connected, and a source-gate voltage $V_{SG2}$ is generated across the source and gate electrodes (node 150 and node 118) of the second transistor 111. The source-gate voltage $V_{SG2}$ is dependent on magnitude of the cell current $I_{CELL}$. The cell current $I_{CELL}$ flows through the fourth transistor 170 to pull down voltage at the gate electrode of the second transistor 111. The cell current $I_{CELL}$ builds up negative charge at the node 118 to set up a potential difference with the node 150. Higher cell current $I_{CELL}$ corresponds to higher source-gate voltage $V_{SG2}$, and lower cell current $I_{CELL}$ corresponds to lower source-gate voltage $V_{SG2}$. Information about the cell current $I_{CELL}$ (e.g., its magnitude) is stored on the second capacitor 112 in the first phase.

Figure 4:
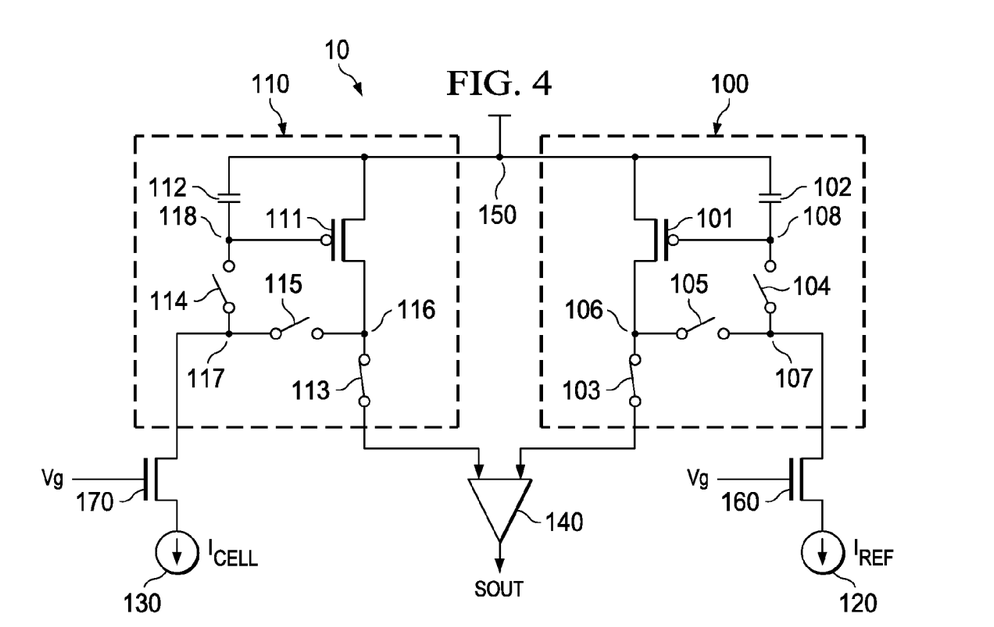
FIG. 4 is a circuit schematic diagram of the sense amplifier circuit in a second phase in accordance with various embodiments of the present disclosure.

FIG. 4 is a circuit schematic diagram of the sense amplifier circuit 10 in a second phase in accordance with various embodiments of the present disclosure. In some embodiments, the second phase is a readout phase. In the second phase, the second, third, fifth and sixth switches 104, 105, 114, 115 are open (turned off, do not conduct), and the first and fourth switches 103, 113 are closed (turned on, conduct). In the readout phase, the third and fourth transistors 160, 170 remain turned on. In some embodiments, a "transition phase" can be defined between the first and second phases. In some embodiments, in the transition phase, the second and fifth switches 104, 114 are opened first, prior to opening the third and sixth switches 105, 115, and prior to closing the first and fourth switches 103, 113. In some embodiments, in the transition phase, the third and sixth switches 105, 115 are opened after opening the second and fifth switches 104, 114, and prior to closing the first and fourth switches 103, 113.

In the second phase, the second capacitor 112 stores substantially the same voltage ($V_{SG2}$) as it did at the end of the first phase. As a result, the second transistor 111, biased by the voltage stored on the second capacitor 112, generates a second current substantially proportional to the cell current $I_{CELL}$ as input to the amplifier 140. In some embodiments, the second current is substantially equal to the cell current $I_{CELL}$.

In the second phase, the first capacitor 102 stores substantially the same voltage ($V_{SG1}$) as it did at the end of the first phase. As a result, the first transistor 101, biased by the voltage stored on the first capacitor 102, generates a first current substantially proportional to the reference current $I_{REF}$ as input to the amplifier 140. In some embodiments, the first current is substantially equal to the reference current $I_{REF}$.

The amplifier 140 outputs the output signal SOUT according to a difference between the first current and the second current. For example, when the second current (corresponding to the cell current $I_{CELL}$) is smaller than the first current (corresponding to the reference current $I_{REF}$), the output signal SOUT is generated having a first logic level (e.g., low or "0"). When the second current (corresponding to the cell current $I_{CELL}$) is larger than the first current (corresponding to the reference current $I_{REF}$), the output signal SOUT is generated having a second logic level (e.g., high or "1").

Figure 5:
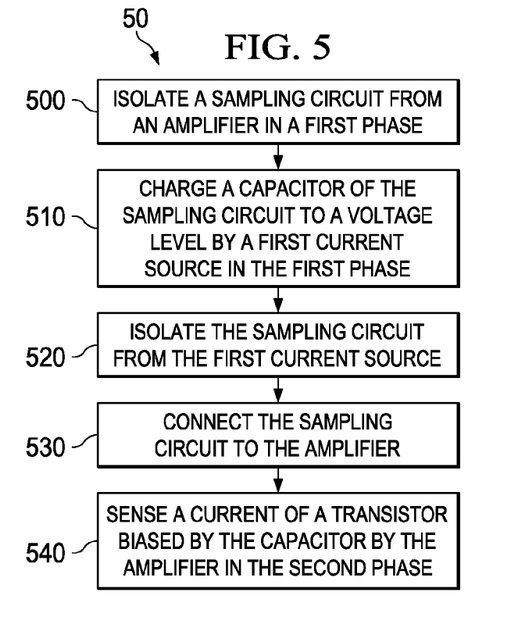
FIG. 5 is a flowchart of a method for sensing cell current of a memory bit cell.

FIG. 5 is a flowchart of a method 50 for sensing cell current of a memory bit cell. In some embodiments, the method 50 is performed by the sense amplifier circuit 10 of FIGS. 1-4. A sampling circuit, such as the reference- or cell-side switched current sampler 100, 110, is electrically isolated 500 from an amplifier (e.g., the amplifier 140) in a first phase. In some embodiments, the electrical isolation 500 is performed by a switch (e.g., the first or fourth switch 103, 113), which is turned off to present high impedance between the sampling circuit and the amplifier. In some embodiments, the electrical isolation 500 is performed on a single side (e.g., the cell side) of the amplifier. In some embodiments, the electrical isolation 500 is performed on both sides of the amplifier.

A capacitor (e.g., the first or second capacitor 102, 112) of the sampling circuit is charged 510 to a voltage level (e.g., $V_{GS1}$, $V_{GS2}$) by a first current source (e.g., the reference current source or the cell current source 120, 130) in the first phase. In some embodiments, the charging 510 is performed through a diode-connected transistor (e.g., the first or second transistor 101, 111) electrically connected to the capacitor by switches (e.g., the second and third, or fifth and sixth switches 104, 105 or 114, 115) that are turned on in the first phase. The charging 510 is performed by electrically connecting the diode-connected transistor and the capacitor to the first current source. First current supplied by the first current source charges a terminal of the capacitor through one of the switches. In some embodiments, the charging 510 is performed on a single side of the amplifier. In some embodiments, the charging 510 is performed on both sides of the amplifier. For example, the reference current $I_{REF}$ or the cell current $I_{CELL}$ may be mirrored to the amplifier 140, instead of being sampled through the operations 500, 510.

The sampling circuit is isolated 520 from the first current source in a second phase or a transition phase (as described above). In some embodiments, the isolating 520 is accomplished by turning off at least one switch (e.g., the second or fifth switch 104, 114). The isolating 520 establishes high impedance between the capacitor and the first current source.

The sampling circuit is electrically connected 530 to the amplifier. In some embodiments, a drain electrode of a PMOS transistor (e.g., the first or second transistor 101, 111) is electrically connected to an input terminal of the amplifier. In some embodiments, the electrical connecting 530 is performed by turning on a switch (e.g., the first or fourth switch 103, 113).

Current flows to the amplifier through the transistor biased by the capacitor carrying the voltage stored during the charging 510. The current is substantially proportional to the first current supplied by the first current source in the first phase. In some embodiments, the current is substantially equal to the first current. The current is sensed 540 by the amplifier in the second phase. In some embodiments, the current is the cell current of the memory bit cell. In some embodiments, the current is the reference current to which the cell current is compared to determine logical state stored by the memory bit cell.

Figure 6:
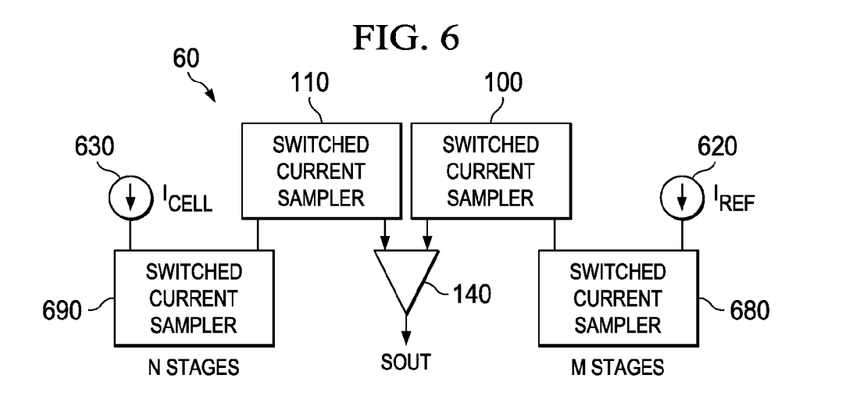
FIG. 6 is a circuit block diagram of a sense amplifier circuit in accordance with various embodiments of the present disclosure.

FIG. 6 is a circuit block diagram of a sense amplifier circuit 60 in accordance with various embodiments of the present disclosure. The sense amplifier circuit 60 includes the amplifier 140, and reference- and cell-side switched current samplers 100, 110 similar to FIGS. 1-4. The sense amplifier circuit 60 further includes M switched current samplers 680 on the reference side, and N switched current samplers 690 on the cell side, where M and N are integers greater than or equal to 1.

Figure 7:
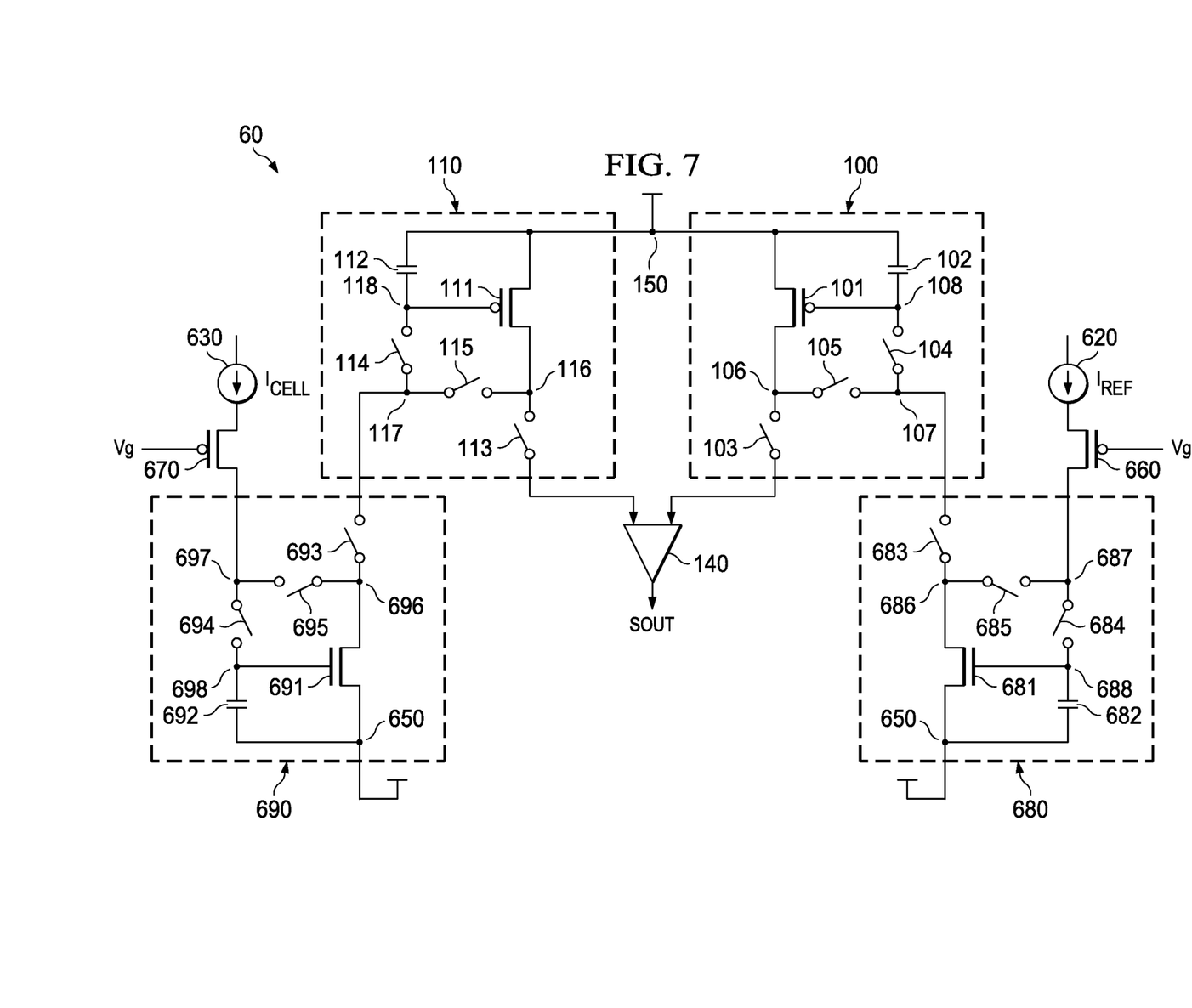
FIG. 7 is a circuit schematic diagram of the sense amplifier circuit of FIG. 6 for M=1 and N=1 in accordance with various embodiments of the present disclosure.

FIG. 7 is a circuit schematic diagram of the sense amplifier circuit 60 for M=1 and N=1 in accordance with various embodiments of the present disclosure. A switch 683 of the switched current sampler 680 has a first terminal electrically connected to the node 107, and a second terminal electrically connected to a node 686. A switch 685 of the switched current sampler 680 has a first terminal electrically connected to the node 686, and a second terminal electrically connected to a node 687. A switch 684 of the switched current sampler 680 has a first terminal electrically connected to the node 687, and a second terminal electrically connected to a node 688.

A gate electrode of a transistor 681 of the switched current sampler 680 is electrically connected to the node 688. A drain electrode of the transistor 681 is electrically connected to the node 686. A source electrode of the transistor 681 is electrically connected to a second power supply node 650. In some embodiments, the transistor 681 is an N-type metal-oxide-semiconductor (NMOS) transistor. A capacitor 682 of the switched current sampler 680 has a first terminal and a second terminal. The first terminal of the capacitor 682 is electrically connected to the node 688. In some embodiments, the second terminal of the capacitor 682 is electrically connected to the node 650. In some embodiments, the second terminal of the capacitor 682 is electrically connected to a DC bias node of the sense amplifier circuit 60 other than the node 650 (e.g., a ground node or fixed DC bias node).

A reference current source 620 is electrically connected to the node 687 through a transistor 660. A source electrode of the transistor 660 is electrically connected to the reference current source 620, and a drain electrode of the transistor 660 is electrically connected to the node 687. A gate electrode of the transistor 660 is biased by a gate voltage Vg, which may be substantially VDD/2 (as described for FIGS. 1-4).

A switch 693 of the switched current sampler 690 has a first terminal electrically connected to the node 117, and a second terminal electrically connected to a node 696. A switch 695 of the switched current sampler 690 has a first terminal electrically connected to the node 696, and a second terminal electrically connected to a node 697. A switch 694 of the switched current sampler 690 has a first terminal electrically connected to the node 697, and a second terminal electrically connected to a node 698.

A gate electrode of a transistor 691 of the switched current sampler 690 is electrically connected to the node 698. A drain electrode of the transistor 691 is electrically connected to the node 696. A source electrode of the transistor 691 is electrically connected to a second power supply node 650. In some embodiments, the transistor 691 is an N-type metal-oxide-semiconductor (NMOS) transistor. A capacitor 692 of the switched current sampler 690 has a first terminal electrically connected to the node 698, and a second terminal electrically connected to the node 650. In some embodiments, the second terminal of the capacitor 692 is electrically connected to a DC bias node other than the node 650.

A cell current source 630 (e.g., a memory bit cell) is electrically connected to the node 697 through a transistor 670. A source electrode of the transistor 670 is electrically connected to the cell current source 630, and a drain electrode of the transistor 670 is electrically connected to the node 697. A gate electrode of the transistor 670 is biased by the gate voltage Vg, which may be substantially VDD/2 (as described for FIGS. 1-4).

Operation of the sense amplifier circuit 60 is similar in many respects to that of the sense amplifier circuit 10. In the sense amplifier circuit 60, three phases are used to sense the cell current $I_{CELL}$ and the reference current $I_{REF}$. For example, in a first pre-charge phase, the switches 683, 693 are opened, and the switches 684, 685, 694, 695 are closed. The reference current $I_{REF}$ charges the capacitor 682, and the cell current $I_{CELL}$ charges the capacitor 692.

In a second sense/pre-charge phase, the switches 683, 693 are closed, and the switches 684, 685, 694, 695 are opened. The second and third switches 104, 105 and the fifth and sixth switches 114, 115 are closed, and the first and fourth switches 103, 113 are opened. First current substantially proportional to the reference current $I_{REF}$ is generated by the transistor 681 biased by the capacitor 682. The first current charges the first capacitor 102. Second current substantially proportional to the cell current $I_{CELL}$ is generated by the transistor 691 biased by the capacitor 692. The second current charges the second capacitor 112.

In a third sense phase, the second and third switches 104, 105 and the fifth and sixth switches 114, 115 are opened, and the first and fourth switches 103, 113 are closed. The third sense phase is similar to the second phase described with reference to FIG. 4. The first transistor 101 generates a third current substantially proportional to the first current due to biasing by the first capacitor 102. The second transistor 111 generates a fourth current substantially proportional to the second current due to biasing by the second capacitor 112. The third and fourth currents are sensed by the amplifier 140 to determine the logical level of the memory bit cell.

Figure 8:
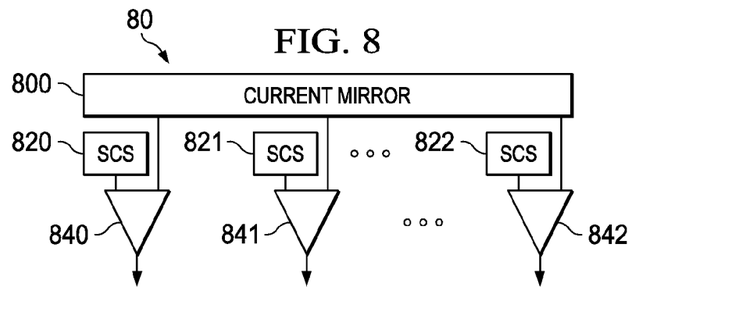
FIG. 8 is a diagram of a sense amplifier circuit in accordance with various embodiments of the present disclosure.

FIG. 8 is a diagram of a sense amplifier circuit 80 in accordance with various embodiments of the present disclosure. In some embodiments, the sense amplifier circuit 80 includes multiple amplifiers 840, 841, . . . , 842 corresponding to multiple lines of a memory array. For example, a memory array may include 1024×512 memory bit cells, and 1024 amplifiers may be used to readout data stored by the memory bit cells. In some embodiments, the reference current $I_{REF}$ is supplied by a current mirror 800. In some embodiments, the cell currents $I_{CELL}$ are sampled by sampling circuits 820, 821, . . . , 822 similar to the reference- or cell-side switched current samplers 100, 110 of FIGS. 1-4. In some embodiments, the cell currents $I_{CELL}$ are supplied to the amplifiers 840, 841, . . . , 842 by the current mirror 800. In some embodiments, the reference current $I_{REF}$ is sampled by the sampling circuits 820, 821, . . . , 822.

Embodiments may achieve advantages. The sense amplifier circuits 10, 60, 80 utilize the switched current samplers 100, 110 (and the like) to sample the cell current $I_{CELL}$ and the reference current $I_{REF}$. Using the same transistor (e.g., the first transistor 101) to sample the cell or reference current and generate the input current inputted to the amplifier 140 eliminates mismatch that is typical of other conceivable configurations that employ current mirrors to "copy" the cell or reference current.

In accordance with various embodiments of the present disclosure, a device includes an amplifier and a first switched current sampler. The first switched current sampler includes a first transistor, a first capacitor, and first, second, and third switches. The first capacitor has a first terminal electrically connected to a gate electrode of the first transistor, and a second terminal electrically connected to a source electrode of the first transistor. The first switch has a first terminal electrically connected to a first current source, and a second terminal electrically connected to the gate electrode of the first transistor. The second switch has a first terminal electrically connected to the first current source, and a second terminal electrically connected to a drain electrode of the first transistor. The third switch has a first terminal electrically connected to the drain electrode of the first transistor, and a second terminal electrically connected to a first input terminal of the amplifier.

In accordance with various embodiments of the present disclosure, a device includes an amplifier, and first and second switched current samplers. The first switched current sampler has a first terminal electrically connected to a first input of the amplifier. The second switched current sampler has a first terminal electrically connected to a second terminal of the first switched current sampler, and a second terminal electrically connected to a first current source.

In accordance with various embodiments of the present disclosure, a method includes (a) isolating a sampling circuit from an amplifier in a first phase; (b) charging a capacitor of the sampling circuit to a voltage by a current source in the first phase; (c) isolating the sampling circuit from the current source; (d) electrically connecting the sampling circuit to the amplifier in a second phase; and (e) sensing current of a transistor biased by the capacitor by the amplifier in the second phase.

As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". Moreover, the term "between" as used in this application is generally inclusive (e.g., "between A and B" includes inner edges of A and B).

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   an amplifier; and
   a first switched current sampler comprising:
   a first transistor;
   a first capacitor having:
      a first terminal electrically connected to a gate electrode of the first transistor; and
      a second terminal electrically connected to a direct current (DC) bias node of the device;
   a first switch having:
      a first terminal electrically connected to a first current source; and
      a second terminal electrically connected to the gate electrode of the first transistor;
   a second switch having:
      a first terminal electrically connected to the first current source; and
      a second terminal electrically connected to a drain electrode of the first transistor; and
   a third switch having:
      a first terminal electrically connected to the drain electrode of the first transistor; and
      a second terminal electrically connected to a first input terminal of the amplifier.

2. The device of claim 1, wherein the first current source is a memory bit cell.

3. The device of claim 1, wherein the first current source is a reference current source.

4. The device of claim 1, further comprising:
a second switched current sampler comprising:
  a second transistor;
  a second capacitor having:
    a first terminal electrically connected to a gate electrode of the second transistor; and
    a second terminal electrically connected to a second DC bias node of the device;
  a fourth switch having:
    a first terminal electrically connected to a second current source; and
    a second terminal electrically connected to the gate electrode of the second transistor;
  a fifth switch having:
    a first terminal electrically connected to the second current source; and
    a second terminal electrically connected to a drain electrode of the second transistor; and
  a sixth switch having:
    a first terminal electrically connected to the drain electrode of the second transistor; and
    a second terminal electrically connected to a second input terminal of the amplifier.

5. The device of claim 4, wherein the first current source is a memory bit cell, and the second current source is a reference current source.

6. The device of claim 1, further comprising:
a third transistor having:
  a drain electrode electrically connected to the first terminal of the first switch; and
  a source electrode electrically connected to the first current source;
wherein the first terminals of the first and second switches are electrically connected to the first current source through the third transistor.

7. A device comprising:
an amplifier;
a first switched current sampler having a first terminal electrically connected to a first input of the amplifier; and
a second switched current sampler having:
  a first terminal electrically connected to a second terminal of the first switched current sampler;
  a second terminal electrically connected to a first current source;
a third switched current sampler having a first terminal electrically connected to a second input of the amplifier; and
a fourth switched current sampler having:
  a first terminal electrically connected to a second terminal of the third switched current sampler; and
  a second terminal electrically connected to a second current source.

8. The device of claim 7, wherein the first current source is a memory bit cell, and the second current source is a reference current source.

9. The device of claim 7, wherein the first switched current sampler has:
a first transistor;
a first capacitor having:
  a first terminal electrically connected to a gate electrode of the first transistor; and
  a second terminal electrically connected to a source electrode of the first transistor;
a first switch having:
  a first terminal electrically connected to the gate electrode of the first transistor;

a second switch having:
  a first terminal electrically connected to a drain electrode of the first transistor; and
a third switch having:
  a first terminal electrically connected to the drain electrode of the first transistor; and
  a second terminal electrically connected to the first input terminal of the amplifier.

10. The device of claim 9, wherein the second switched current sampler has:
a second transistor;
a second capacitor having:
  a first terminal electrically connected to a gate electrode of the second transistor; and
  a second terminal electrically connected to a source electrode of the second transistor;
a fourth switch having:
  a first terminal electrically connected to the first current source; and
  a second terminal electrically connected to the gate electrode of the first transistor;
a fifth switch having:
  a first terminal electrically connected to a drain electrode of the second transistor; and
  a second terminal electrically connected to the first current source; and
a sixth switch having:
  a first terminal electrically connected to the drain electrode of the first transistor; and
  a second terminal electrically connected to second terminals of the first and second switches.

11. The device of claim 10, wherein the first transistor is a P-type metal-oxide-semiconductor transistor, and the second transistor is an N-type metal-oxide-semiconductor transistor.

12. A method of sensing current of a transistor comprising:
(a) isolating a first sampling circuit and a second sampling circuit from an amplifier in a first phase;
(b) charging a first capacitor of the first sampling circuit to a voltage by a first current source, and a second capacitor of the second sampling circuit to a second voltage by a second current source in the first phase;
(c) isolating the first sampling circuit from the first current source and the second sampling circuit from the second current source in a second phase;
(d) electrically connecting the first sampling circuit and the second sampling circuit to the amplifier in the second phase;
(e) generating a first current substantially proportional to the first current source through a first transistor biased by the first capacitor, and
(f) sensing, by the amplifier, current of the first transistor biased by the first capacitor, in the second phase.

13. The method of claim 12, wherein (a) includes:
opening a switch having a first terminal electrically connected to the amplifier, and a second terminal electrically connected to a drain electrode of the first transistor.

14. The method of claim 12, wherein (b) includes:
closing a first switch having a first terminal electrically connected to the first current source, and a second terminal electrically connected to a gate electrode of the first transistor; and
closing a second switch having a first terminal electrically connected to the first current source, and a second terminal electrically connected to a drain electrode of the first transistor.

15. The method of claim 12, wherein (b) includes:
charging the first capacitor to the voltage by a memory bit cell in the first phase.

16. The method of claim 12, wherein (b) includes:
charging the first capacitor to the voltage by a reference current source in the first phase.

17. The method of claim 12, wherein (c) includes:
closing a switch having a first terminal electrically connected to the amplifier, and a second terminal electrically connected to a drain electrode of the first transistor.

18. The method of claim 12, wherein (d) includes:
opening a first switch having a first terminal electrically connected to the first current source, and a second terminal electrically connected to a gate electrode of the first transistor; and
opening a second switch having a first terminal electrically connected to the first current source, and a second terminal electrically connected to a drain electrode of the first transistor.

19. The method of claim 12, wherein (e) further comprises generating a second current substantially proportional to the second current source through a second transistor biased by the second capacitor.

20. The method of claim 12, wherein (f) further comprises sensing, by the amplifier, current of the second transistor biased by the second capacitor, in the second phase.

* * * * *